(12) United States Patent
Hashimoto

(10) Patent No.: US 8,143,728 B2
(45) Date of Patent: Mar. 27, 2012

(54) ELECTRONIC BOARD AND MANUFACTURING METHOD THEREOF, ELECTRO-OPTICAL DEVICE, AND ELECTRONIC APPARATUS

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 421 days.

(21) Appl. No.: 11/484,520

(22) Filed: Jul. 11, 2006

(65) Prior Publication Data

US 2007/0015363 A1    Jan. 18, 2007

(30) Foreign Application Priority Data

Jul. 14, 2005    (JP) .................................. 2005-205464

(51) Int. Cl.
*H01L 23/52* (2006.01)
(52) U.S. Cl. ........................ 257/778; 257/536
(58) Field of Classification Search ............. 257/737, 257/778, 536–538
See application file for complete search history.

(56) References Cited

U.S. PATENT DOCUMENTS

| | | | |
|---|---|---|---|
| 5,038,132 A | 8/1991 | Lindblom et al. | |
| 5,477,087 A | 12/1995 | Kawakita et al. | |
| 5,666,270 A | 9/1997 | Matsuda et al. | |
| 5,783,465 A | 7/1998 | Canning et al. | |
| 5,877,556 A | 3/1999 | Jeng | |
| 6,193,911 B1 | 2/2001 | Hunt et al. | |
| 6,255,737 B1 | 7/2001 | Hashimoto | |
| 6,666,980 B1 | 12/2003 | Wikstrom | |
| 7,002,250 B2 | 2/2006 | Hozoji et al. | |
| 7,084,498 B2 | 8/2006 | Yamaguchi et al. | |
| 2002/0060833 A1* | 5/2002 | Yamaguchi | 359/245 |
| 2002/0163611 A1* | 11/2002 | Kamijima et al. | 349/122 |
| 2004/0124529 A1* | 7/2004 | Hanaoka | 257/738 |
| 2004/0246692 A1 | 12/2004 | Satoh et al. | |
| 2005/0212085 A1* | 9/2005 | Hashimoto et al. | 257/537 |
| 2005/0236104 A1* | 10/2005 | Tanaka | 156/308.2 |
| 2008/0174976 A1 | 7/2008 | Satoh et al. | |

FOREIGN PATENT DOCUMENTS

| | | |
|---|---|---|
| EP | 0 540 820 | 5/1993 |
| JP | 58-007848 | 1/1983 |
| JP | 63-152164 | 6/1988 |
| JP | 05-145018 | 6/1993 |
| JP | 10-084084 | 3/1998 |
| JP | 2001-010098 | * 1/2001 |
| JP | 2001-110831 | * 4/2001 |
| JP | 2002-506293 | 2/2002 |
| JP | 2003-031724 | 1/2003 |
| JP | 2003-046026 | 2/2003 |
| JP | 2003-121868 | 4/2003 |
| JP | 2003-124393 | 4/2003 |
| JP | 2003-282788 | 10/2003 |
| JP | 2004-273525 | 9/2004 |
| JP | 2004-296761 | 10/2004 |
| JP | 2005-175402 | 6/2005 |
| TW | 571373 | 1/2004 |
| WO | WO03-007379 | 1/2003 |

* cited by examiner

*Primary Examiner* — Steven Loke
*Assistant Examiner* — Kimberly M Thomas
(74) *Attorney, Agent, or Firm* — Harness, Dickey & Pierce, P.L.C.

(57) ABSTRACT

An electronic board includes: a substrate; and a wiring pattern provided on the substrate and having a part that forms a resistance element, the part having wiring specifications that are different from those of other parts.

8 Claims, 12 Drawing Sheets

ELECTRONIC BOARD AND MANUFACTURING METHOD THEREOF, ELECTRO-OPTICAL DEVICE, AND ELECTRONIC APPARATUS

CROSS-REFERENCE TO RELATED APPLICATION

This application claims priority to Japanese Patent Application No. 2005-205464, filed Jul. 14, 2005, the contents of which are incorporated herein by reference.

BACKGROUND

1. Technical Field

The present invention relates to an electronic board and manufacturing method thereof, an electro-optical device, and electronic apparatus.

2. Related Art

In recent years, miniaturization and densification of the packaging of semiconductor device are being demanded with the miniaturization and higher functionality of electronic apparatus. The technology of integrating resistances using polysilicon on semiconductor elements is a well-known example of this case. For instance, the technology for forming resistance using polycrystalline grain boundary doped with impurities in polysilicon has been disclosed in Japanese Unexamined Patent Application, First Publication No. S58-7848. Also, the technology for forming a resistance section by applying and curing resistance paste by the thick film formation method in a rearranged wiring section on a semiconductor element, has been disclosed in Japanese Unexamined Patent Application, First Publication No. 2003-46026.

When performing impedance control and the like using passive elements such as a resistance installed on a substrate, the resistance value has to be accurately controlled. However, it is difficult to ensure the required accuracy in the art mentioned above, and resistance sections with high reliability cannot be obtained. Moreover, an independent process is necessary to form the resistance section, and the problem in the art mentioned above is that productivity decreases.

SUMMARY

An advantage of some aspects of the invention is to provide an electronic board and manufacturing method thereof, an electro-optical device, and an electronic apparatus that enables highly accurate resistance sections to be formed easily.

An electronic board according to an aspect of the invention includes: a substrate; and a wiring pattern provided on the substrate and having a part that forms a resistance element, the part having wiring specifications that are different from those of other parts.

In the electronic board, a resistance element can be easily formed by varying the wiring specifications of a part of the wiring pattern such that a resistance value of the part becomes higher compared to that of other parts. This resistance element is formed by the wiring pattern; therefore, an independent process for forming a separate resistance element is not necessary. Thus, the decrease in productivity can be avoided. By adjusting the wiring specifications of the wiring pattern, a resistance element of the desired resistance value can be formed. In the electronic board, the wiring pattern may be connected to an electrode section and an external terminal (such as the Wafer Level Chip Size Package (WFCSP)). In the electronic board, the wiring pattern can be connected to an electrode section or a connection terminal. In the electronic board, the wiring pattern may be connected to can be an electrode section and an external terminal (such as the Wafer Level Chip Size Package (WFCSP)).

Preferably in the electronic board, a width of a part corresponding to the resistance element in the wiring pattern differs from that of other parts, or a thickness of a part corresponding to the resistance element in the wiring pattern differs from that of other parts.

Preferably in the electronic board, a number of layers of a part corresponding to the resistance element in the wiring pattern is smaller than that of other parts. In this case, the wiring pattern may have a first pattern and a second pattern, the second pattern formed on the first pattern with a material different from that of the first pattern, and wherein a part of the second pattern corresponding to the resistance element may have been removed. In this configuration, by removing a part of the second pattern by etching or the like, a resistance element made of the first pattern can be formed locally in the wiring pattern. By selecting an etching material that suits the second pattern, only the second pattern can be removed easily. In this case, the first pattern should preferably be formed by a material with a larger resistance value than that of the material of the second pattern. As a result, the resistance element with a large resistance value can be easily formed.

Preferably in the electronic board, the resistance element is sealed by a sealing material. As a result, the resistance element is protected, and corrosion and short circuits are prevented.

Preferably in the electronic board, the resistance element should preferably be formed on a stress relaxation layer. As a result, the degradation in reliability and life of the resistance element can be inhibited even if thermal stress is applied to the substrate.

Preferably in the electronic board, the connection terminal is a bump electrode that has a resin core of which at least a top part is covered by the wiring pattern. As a result, the resistance element can be formed near the bump electrode; therefore, the shortest route between the bump electrode and the resistance element can be attained and the wiring can be reduced significantly.

Preferably in the electronic board, a semiconductor element is provided on the substrate. Therefore, the shortest route between the semiconductor element and the resistance element can be attained, and the wiring can be reduced significantly.

In this case, switching element such as transistor formed by wiring pattern on the active area or semiconductor chip with built-in semiconductor element mounted on the active area can be used as the semiconductor element. In the electronic board, no semiconductor element may be provided on the substrate. That is, a not-installed semiconductor element, for instance, and even one in the silicon substrate condition, may be used.

An electro-optical device according to another aspect of the invention includes the electronic board mentioned above. An electronic apparatus according to further another aspect of the invention, includes the electronic board or the electro-optical device mentioned above. As a result, high quality electro-optical device and electronic apparatus formed by highly accurate resistance elements can be formed; moreover, efficient manufacturing of electro-optical device and electronic apparatus without decrease in productivity can be realized.

An electronic board manufacturing method according to further another aspect of the invention includes: forming a wiring pattern on a substrate; and forming a resistance element in a part of the wiring pattern, the part having wiring specifications that are different from those in other parts.

In the manufacturing method, a resistance element can be easily formed by varying the wiring specifications of a part of the wiring pattern such that a resistance value of the part becomes higher compared to that of other parts. This resistance element is formed by the wiring pattern; therefore, an independent process for forming a separate resistance element is not necessary. Thus, the decrease in productivity can be avoided. By adjusting the wiring specifications of the wiring pattern, a resistance element of the desired resistance value can be formed. In the manufacturing method, the wiring pattern can be connected to an electrode section or a connection terminal. In the manufacturing method, the wiring pattern may be connected to can be an electrode section and an external terminal (such as the Wafer Level Chip Size Package (WFCSP)).

Preferably in the manufacturing method, the forming of the resistance element includes removing a part of the wiring pattern in the width or thickness direction.

Preferably in the manufacturing method, the wiring pattern has a first pattern and a second pattern, the second pattern formed on the first pattern with a material different from that of the first pattern, and wherein the forming of the resistance element comprises removing a part of the second pattern corresponding to the resistance element. In the manufacturing method, by removing a part of the second pattern by etching or the like, a resistance element made of the first pattern can be formed locally in the wiring pattern. By selecting an etching material that suits the second pattern, only the second pattern can be removed easily. In this case, the first pattern should preferably be formed by a material with a larger resistance value than that of the material of the second pattern. As a result, the resistance element with a large resistance value can be easily formed.

In the manufacturing method, further includes sealing the resistance element with a sealing material. As a result, the resistance element is protected, and corrosion and short circuit are prevented.

The manufacturing method may include: forming a protective film on the wiring pattern; and removing the protective film in an area of a part of the wiring pattern and forming an opening, wherein the forming of the resistance element comprises removing a part of the wiring pattern through the opening. As a result, during the deposition of a protective film for providing a solder ball for instance, if an opening for resistance element is formed together with an opening for a connection terminal, and if a part of the wiring pattern can be removed through the opening for the resistance element, then a resistance element can be formed easily and there is no need to use a separate process for forming an opening for a resistance element.

DESCRIPTION OF EXEMPLARY EMBODIMENTS

Figure 1:
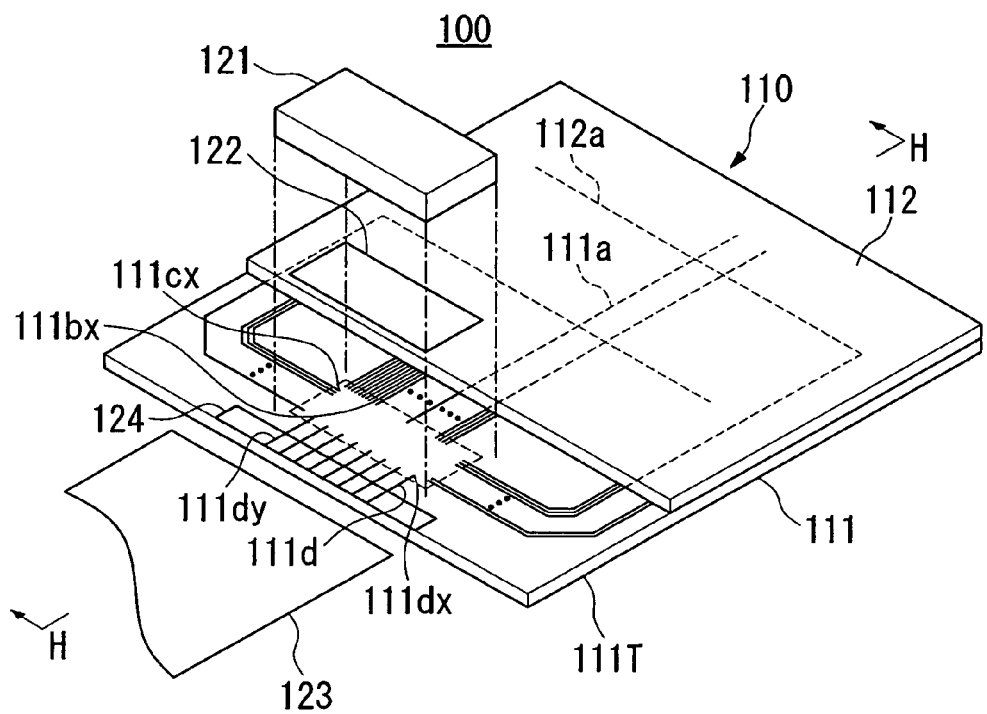
FIG. 1 is a schematic drawing showing a liquid crystal display device, which is the first embodiment of an electro-optical device.

The embodiments of the present invention are described below referring to the drawings from FIG. 1 to FIG. 12.

Electro-Optical Device

FIG. 1 is a schematic drawing showing a liquid crystal display device, which is the first embodiment of an electro-optical device of the present invention. The illustrated liquid crystal display device 100 includes a liquid crystal panel 110 and a semiconductor device 121. If necessary, accessory members (not shown in the drawings), such as polarizing plate, reflecting sheet, and backlight may be appropriately installed.

The liquid crystal panel 110 includes substrates 111 and 112 made of glass or plastic. The substrates 111 and 112 face each other, and are stuck to each other using sealing material and the like, not shown in the drawings. Liquid crystal (not shown in the drawings), which is made of electro-optical material, is sealed between the substrate 111 and the substrate 112. An electrode 111a made of a transparent conductor such as Indium Tin Oxide (ITO) is formed on the inner surface of the substrate 111. An electrode 112a facing the electrode 111a is formed on the inner surface of the substrate 112. Electrode 111a and electrode 112a are disposed perpendicular to each other. The electrode 111a and the electrode 112a are each led to a flared section 111T, at the end of which electrode terminal 111bx and electrode terminal 111cx respectively, are formed. Input wire 111d is formed near the edge of the flared section 111T, and terminal 111dx is also formed within its end.

A semiconductor device 121 is mounted on the flared section 111T through sealing resin 122. The semiconductor device 121 is an IC chip for driving the liquid crystal that drives the liquid crystal panel 110, for instance. Multiple bump electrodes (not shown in the drawings) are formed on the under surface of semiconductor device 121. These bumps are conductively connected to the terminals 111bx, 111cx, and 111dx on the flared section 111T.

A flexible wiring substrate 123 is mounted on the input terminal 111dy formed on the outer edge of the input wire 111d through an anisotropic conductive film 124. The input terminal 111dy is conductively connected to each of the wires (not shown in the drawings) installed in the flexible wiring substrate 123. Control signals, image signals, power source voltage and the like are supplied to the input terminal 111dy through the flexible wiring substrate 123 from the outside, drive signals for driving the crystals in the semiconductor device 121 are generated, and these are supplied to the liquid crystal panel 110.

According to the liquid crystal display device 100 of the present embodiment configured as mentioned above, by applying appropriate voltage between the electrode 111a and the electrode 112a through the semiconductor device 121, the liquid crystals in picture elements of the two facing electrodes 111a and 112a can be re-oriented and light can be modulated. As a result, the picture elements in the liquid crystal panel 110 can form the desired image in the display area in which the elements are arranged.

Figure 2:
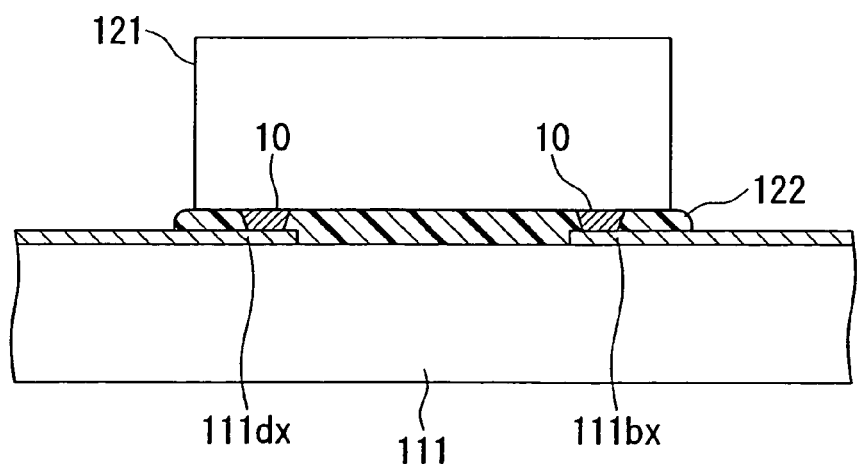
FIG. 2 is an explanatory drawing of the mounting construction of a semiconductor device in the liquid crystal display device.

FIG. 2 is the cross sectional side view at the H-H line in FIG. 1. It is an explanatory drawing showing the mounted construction of semiconductor device 121 on the liquid crystal display device 100. Multiple bump electrodes 10 are installed on the active surface (under surface shown in the drawing) of the semiconductor device 121 as shown in FIG. 2, the front ends of which are in direct conductive contact with terminals 111bx and 111dx of the substrate 111. Cured sealing resin 122 made of a resin, such as thermosetting resin, is filled around the conductive contact parts between terminals 111bx and 111cx, and the bump electrodes 10.

First Embodiment

Figure 3:
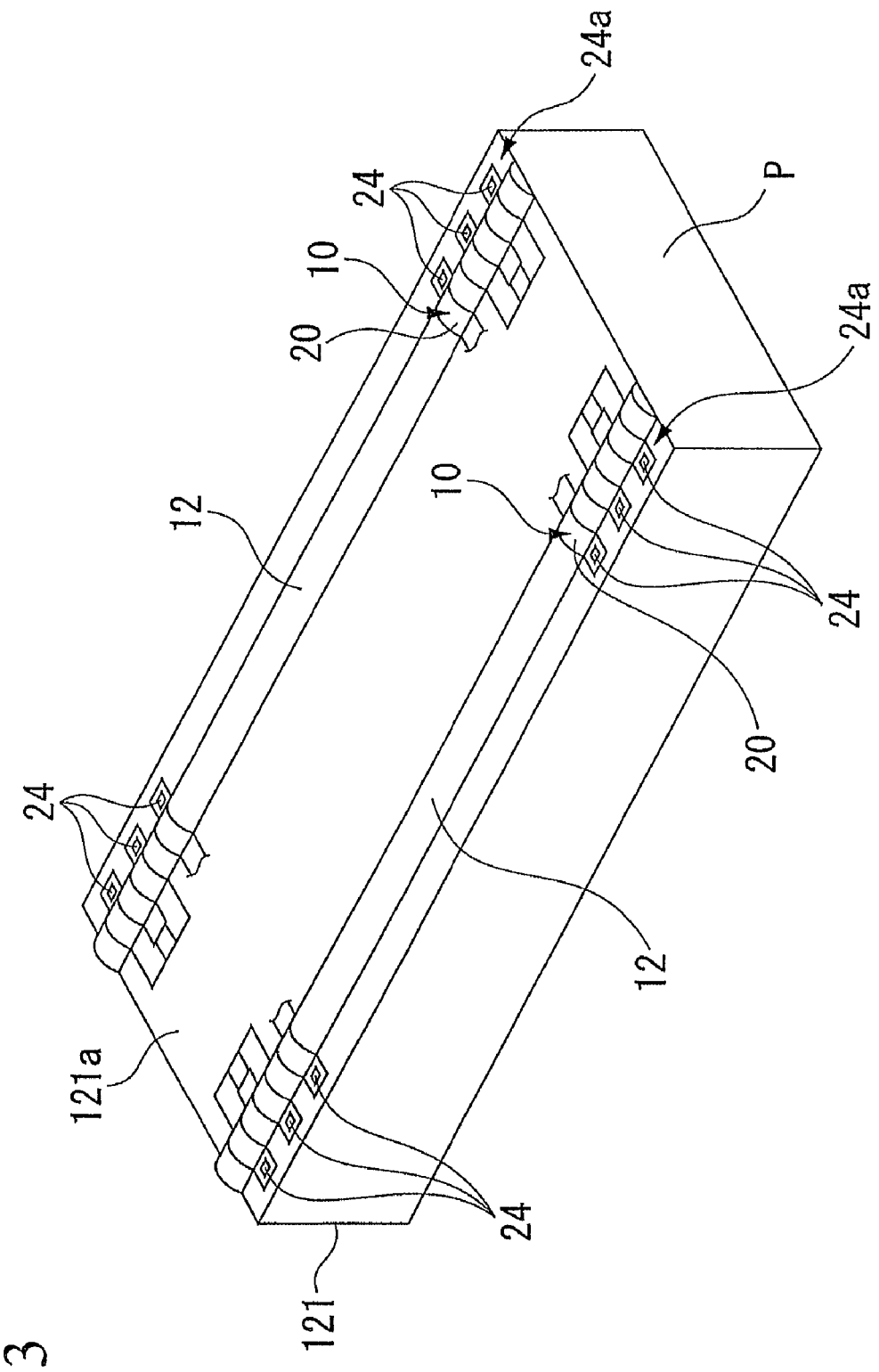
FIG. 3 is a perspective view of the semiconductor device.

Next, the terminal construction of semiconductor device 121 as the electronic board related to the first embodiment is described below. FIG. 3 is a partial perspective view showing the construction on the side of the active surface of the semiconductor device 121 on which terminals are formed.

The semiconductor device 121 may be, for instance, an IC chip driving picture elements of a liquid crystal display device, and on its active surface side, electronic circuits (integrated circuits) of wiring connecting electronic elements or multiple electronic elements such as thin film transistors are formed (none of which is shown in the drawings).

Multiple electrode pads (electrode sections) 24 are aligned along the longer side of the active surface 121a of substrate P in the semiconductor device 121 shown in FIG. 3. These electrode pads are drawn from the electronic elements mentioned above, and they function as external electrodes of the electronic circuit. On the inside of the electrode pad row 24a in the active surface 121a, resin protrusion 12 is formed as a continuous straight shape extending along the electrode pad row 24a. Furthermore, multiple conductive films 20 are formed as wiring patterns (metallic wiring) connecting the upper part of the resin protrusion 12 and each electrode pad 24 extending from the surface of each electrode pad 24 to the surface of the resin protrusion 12. The bump electrode 10 includes resin protrusion 12 as the core and multiple conductive films 20 disposed on the surface of the resin protrusion 12. In the example shown in FIG. 3, resin protrusion 12 is arranged on the inside of the electrode pad row 24a; however, the resin protrusion 12 may be arranged on the outside of the electrode pad row 24a.

Figure 4A:
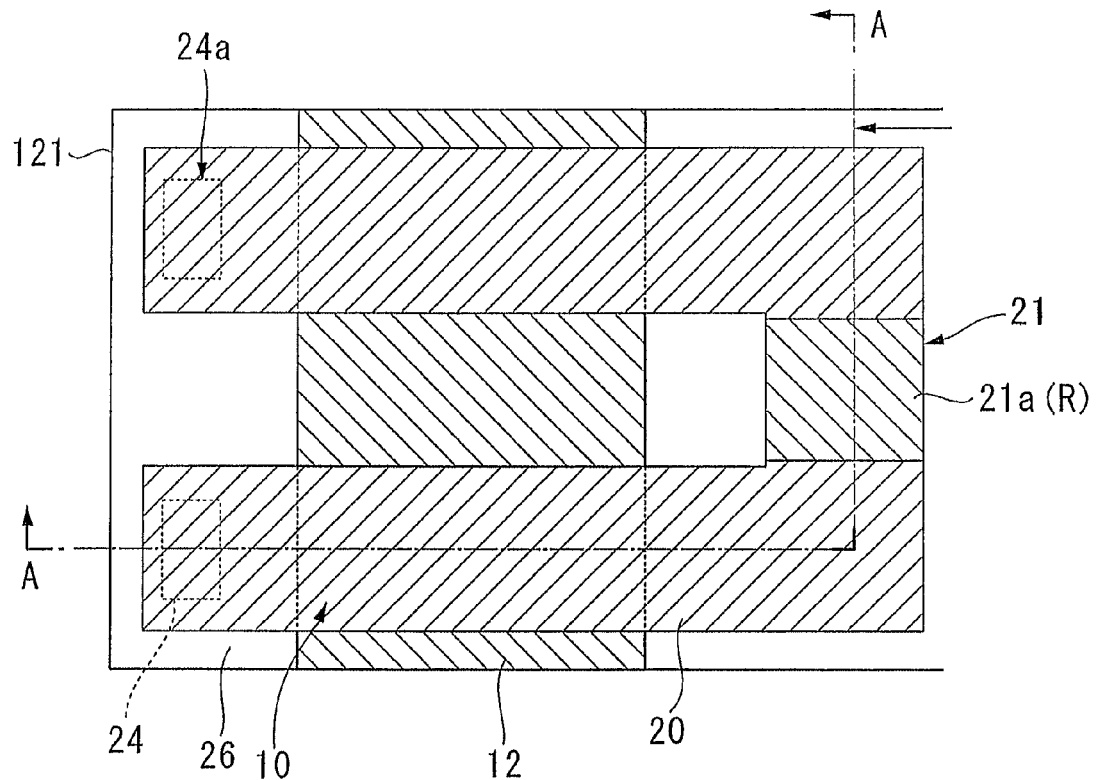
FIG. 4A and FIG. 4B are expanded views of the terminal parts of the semiconductor device.
Figure 4B:
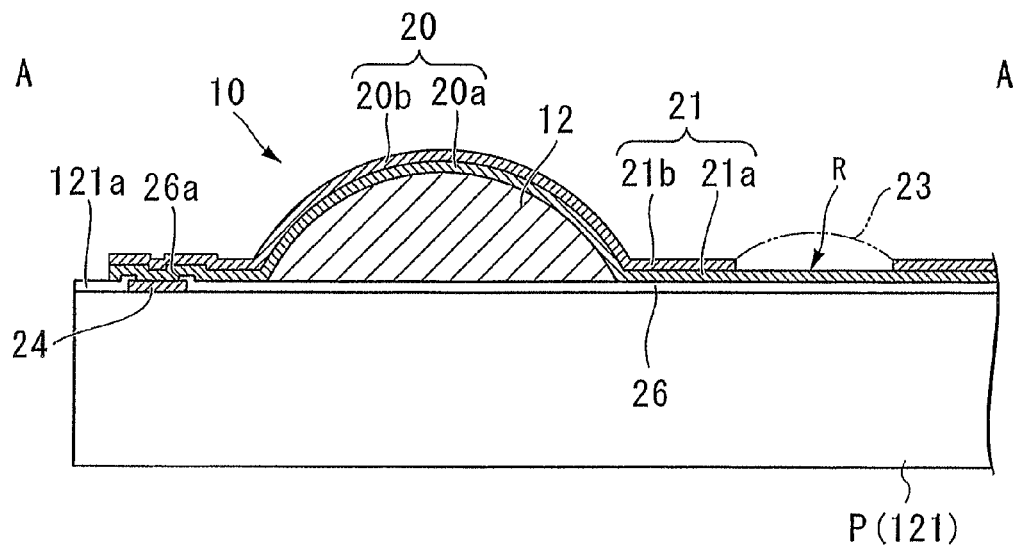

FIG. 4A and FIG. 4B show the configuration of the main part of bump electrode 10. FIG. 4A is the enlarged plan view around the bump electrode, while FIG. 4B is a cross sectional side view at the line A-A in FIG. 4A.

As shown in FIG. 4A and FIG. 4B, multiple electrode pads 24 made of a conductive material such as A1, are arranged and formed at the peripheral edges of the active surface 121a of the semiconductor device 121. A passivation film 26 made of an electrical insulating material such as SiN is formed as a protective layer all over the active surface of the semiconductor device 121. An opening 26a in the passivation film 26 is formed on the surface of each electrode pad 24. An organic resin film such as polyimide film with good stress relaxation property should preferably be formed on the entire surface or part thereof other than the opening in the passivation film 26.

The resin protrusion 12 is formed on the inside of the electrode pad row 24a and on the surface of the passivation film 26. The resin protrusion 12 is formed so as to project from the active surface 121a of the semiconductor device 121, and it extends in a straight line at approximately the same height. It is arranged parallel to the electrode pad row 24a. This resin protrusion 12 is made of an elastic resin material such as polyimide resin or acrylic resin, phenolic resin, epoxy resin, silicone resin, or modified polyimide resin, and is formed by using a method such as the ink jet method. As shown in FIG. 4B, the cross section shape of the resin protrusion 12, should preferably be an elastic shape that can be easily deformed, such as a semi circular shape or a trapezoidal shape. In this way, the bump electrode 10 can be elastically deformed with ease during contact with the other substrate, and the reliability of the conductive connection with the other substrate can be enhanced.

Conductive film 20 is formed to connect the upper part of the resin protrusion 12 and each electrode pad 24, extending from the surface of each electrode pad 24 and beyond the surface of the resin protrusion 12. The conductive film 20 is formed as a near U-shape connected to adjacent conductive film 20 by a connecting section of the conductive film (wiring pattern) 21 that extends in a direction perpendicular to the conductive film 20 at the end on the side opposite to the electrode pad 24. The conductive films 20 and 21, including part of the connecting section, have a double-layer wiring construction including conductive films (first patterns) 20a and 21 a, and conductive films (second patterns) 20b and 21 b laminated on the conductive films 20a and 21 a.

The conductive films 20a and 21a according to the present embodiment are each formed by sputtering with TiW. The conductive films 20b and 21 b are formed with Au. The conductive film 21a has a higher resistance value than the conductive film 21b.

The material, film composition, and area of resistance section of each conductive film used can be varied appropriately according to the resistance value to be obtained. In the embodiment below, the configuration of a double-layered conductive film is described, but details are given later. Conductive films of more than three layers may be combined according to the temperature characteristics and the resistance value to be obtained. Moreover, the conductive film may be formed using known methods such as vapor deposition and plating, in addition to sputtering.

As shown in FIG. 1, the bump electrode 10 is bonded by thermo-compression bonding to terminal 111bx on substrate 111 through sealing resin 122. Sealing resin 122 is a thermosetting resin, and is in the uncured condition or half-cured condition before the mounting. If the sealing resin 122 is in the uncured condition, before the mounting, sealing resin 122 may be coated on the active surface (under surface shown in the drawing) of the semiconductor device 121 or on the surface of the substrate 111. If the sealing resin 122 is in the half-cured condition, then sealing resin 122 may be disposed in the film condition or in the sheet condition between the semiconductor device 121 and the substrate 111. Epoxy resin is generally used as the sealing resin 122, but any other resin may be used if the same objectives as epoxy resin are attained.

The semiconductor device 121 is mounted by using a heating and pressurizing head and the like, not shown in the drawings, and disposing the semiconductor device 121 on the substrate 111 while heating and pressurizing it. At this stage, the sealing resin 122 becomes soft initially because of heating, and the upper part of the bump electrode 10 comes in conductive contact with the terminal 111bx by pushing its way through the softened resin. Because of pressurizing, the resin protrusion 12, an internal resin, is pressurized and it elastically deforms in the direction of contact (vertical direction shown in the drawing). If the heating is continued further in this condition, the sealing resin 122 after cross linking, becomes thermally cured. Thus, even if the pressurizing force is released, the bump electrode 10 is maintained in an elastic deformation condition while in conductive contact condition with the terminal 111bx because of the sealing resin 122.

Semiconductor Device Manufacturing Method

Next, the manufacturing method of semiconductor device is described here, specifically, the process of formation of the bump electrode 10.

FIG. 5A to FIG. 5G are process drawings that show an example of the manufacturing method of semiconductor device 121. This manufacturing method includes a process of forming a passivation layer 26, a process of forming the resin protrusion 12, and a process of forming the conductive films 20 and 21. The present embodiment uses the inkjet method to form resin protrusion 12.

Figure 5A:
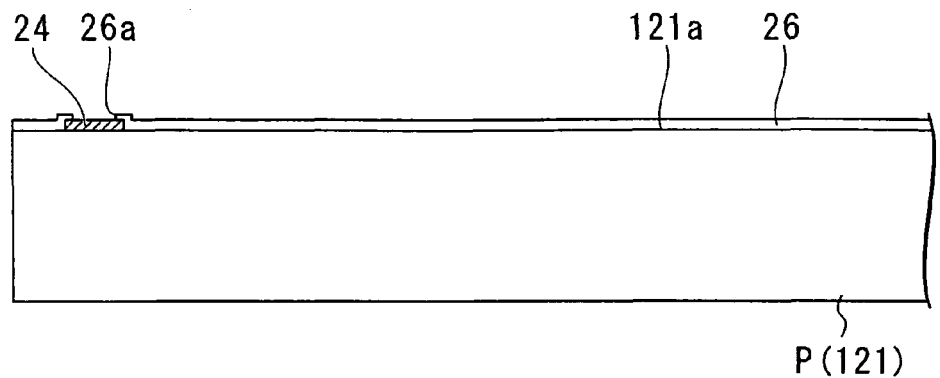
FIGS. 5A, 5B, 5C, 5D, 5E, 5F, and 5G are process drawings for explaining the semiconductor device manufacturing method.

As shown in FIG. 5A, a passivation layer 26 is formed on the active surface 121a of substrate P on which semiconductor elements (not shown in the drawings) are formed. That is, after forming a passivation film 26 made of $SiO_2$, SiN, and the like by the deposition method on the substrate P, opening 26a that exposes the electrode pad 24, is formed by patterning using the photolithographic method. The resist layer is formed on the passivation film 26 by a method such as the spin coating method, the dipping method, or the spray coating method. Moreover, the resist layer is subjected to exposure and development processes using a mask on which specific patterns are formed, and a resist pattern (not shown in the drawings) of specific shape is formed for the opening 26a. Subsequently, this resist pattern is masked, the above-mentioned film is etched, and the opening 26a for exposing the electrode pad 24 is formed. Then the resist pattern is removed by using a stripper and the like. Dry etching is preferable, using Reactive Ion Etching (RIE) as the preferred process. Wet etching may also be used for etching.

An organic resin film such as polyimide film with good stress relaxation property may be formed on the entire surface or part thereof other than the opening part in the passivation film 26. That is, the resistance element R may be formed on the organic resin film (insulating film) using the methods below.

Figure 5B:
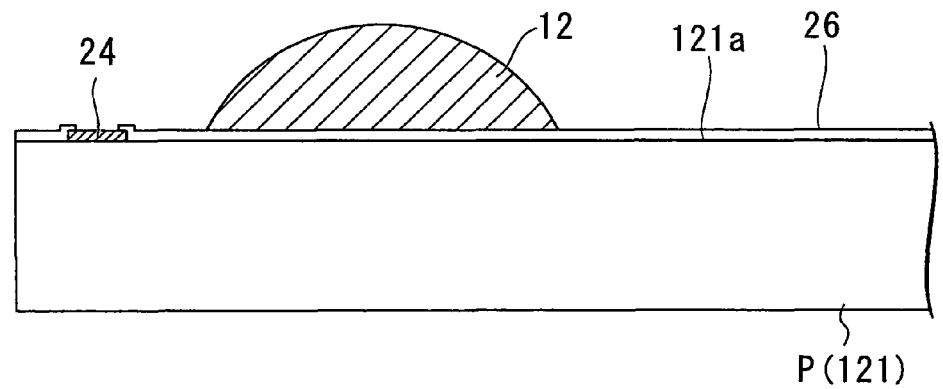

Next, as shown in FIG. 5B, resin protrusion 12 is formed using the inkjet method (droplet ejection method) on the active surface 121 of substrate P on which electrode pad 24 and passivation film 26 are formed. In this inkjet method, resin material in droplet form with the liquid amount per drop controlled using a nozzle installed in the droplet ejection head, is ejected (dripped), the nozzle is faced toward the substrate P, and furthermore, the nozzle and the substrate P are moved relatively to form film pattern of resin material of the desired shape on the substrate P. The resin protrusion 12 is obtained by heat treatment of this film pattern.

By dripping multiple droplets from the droplet ejection head to dispose the resin material, the shape of the film formed from the resin material can be arbitrarily set, and thick film of resin protrusion 12 can be formed by deposition of the resin material. For instance, dry film of the resin material is deposited and the resin protrusion 12 becomes a proper thick film by repetitively implementing the process of disposing resin material on the substrate P and the process of drying the resin material. Also, by dripping droplets that include resin material from multiple nozzles installed in the droplet ejection head, the amount disposed and the timing of disposition of the resin material can be partially controlled. The resin protrusion 12 may be formed by a method such as photolithographic method, and by allowing the material to droop around the protrusion during curing, resin protrusion 12 of the desired shape may be obtained.

Figure 5C:
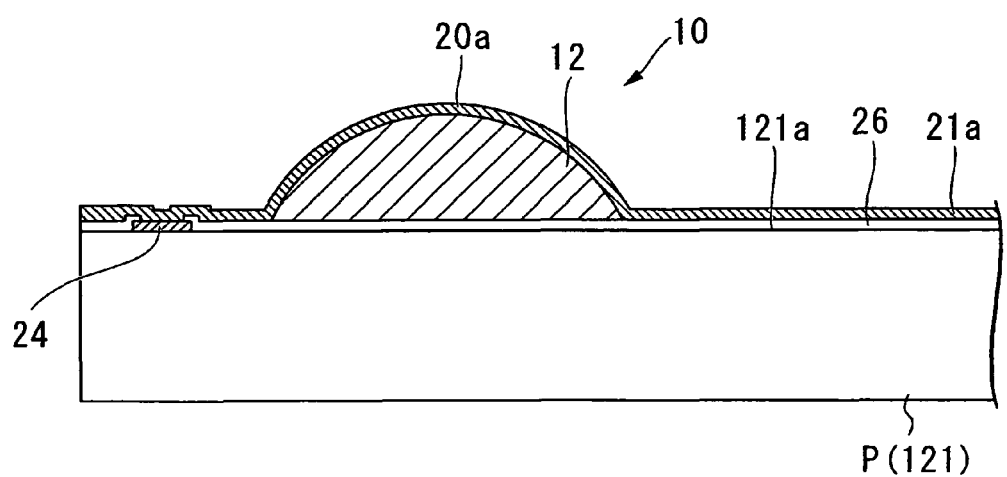

Next, as shown in FIG. 5C, conductive films 20a and 21a are formed as metallic wires that cover the upper parts of electrode pad 24 and resin protrusion 12 extending from the surface of the electrode pad 24 to the resin protrusion 12. These conductive films 20a and 21a are not patterned films but are formed overall.

Figure 5D:
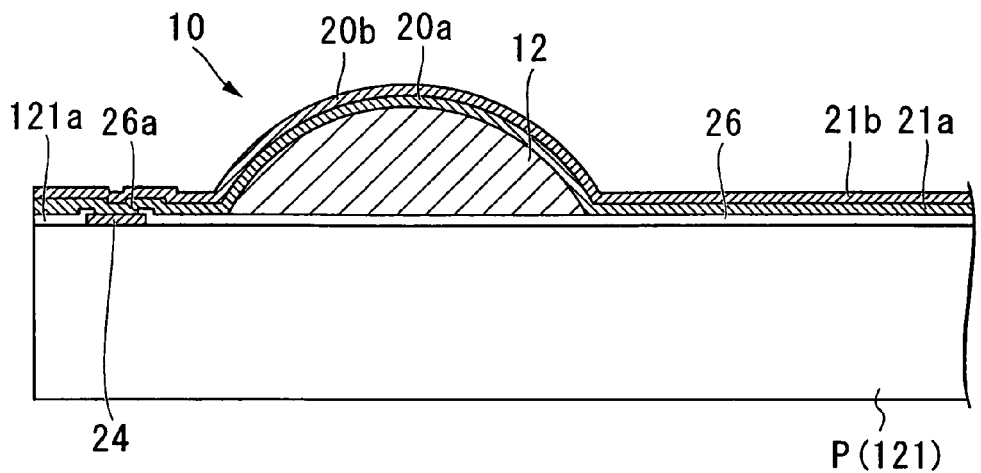

Next, as shown in FIG. 5D, conductive films 20b and 21b are formed on the conductive films 20a and 21a by sputtering. Conductive films 20a and 21a are also not patterned films but are formed overall. Subsequently, conductive films 20b and 21b with shape shown in FIG. 3, FIG. 4A, and FIG. 4B, are formed by patterning by the photolithographic method, similar to the passivation film 26.

Figure 5E:
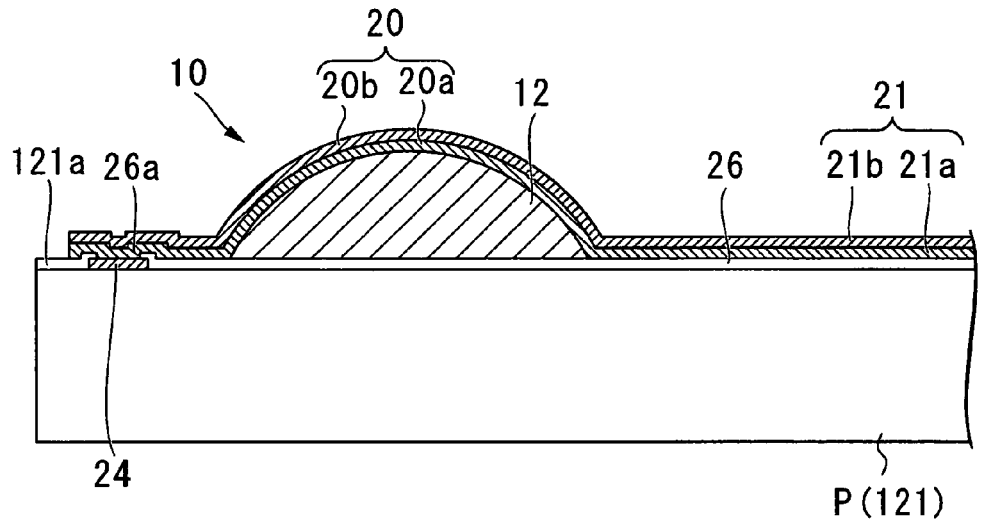

More specifically, resist layer is formed on conductive films 20b and 21b, by methods such as the spin coating method, the dipping method, and the spray coating method. Moreover, the resist layer is subjected to exposure and development processes, using mask with specific pattern formed on it, and resist pattern with specific shape is formed (pattern that opens areas other than specific wiring pattern). Subsequently, this resist pattern is masked and the above-mentioned film is etched. Then the resist pattern is removed by using a stripper to obtain conductive films 20b and 21b of specific shape. Next, the patterned conductive films 20b and 21b are masked and etched. As shown in FIG. 5E, the conductive films 20a and 21a are patterned with the same shape as the conductive films 20b and 21b. The result is that double-layer conductive films 20 and 21 are formed.

Figure 5F:
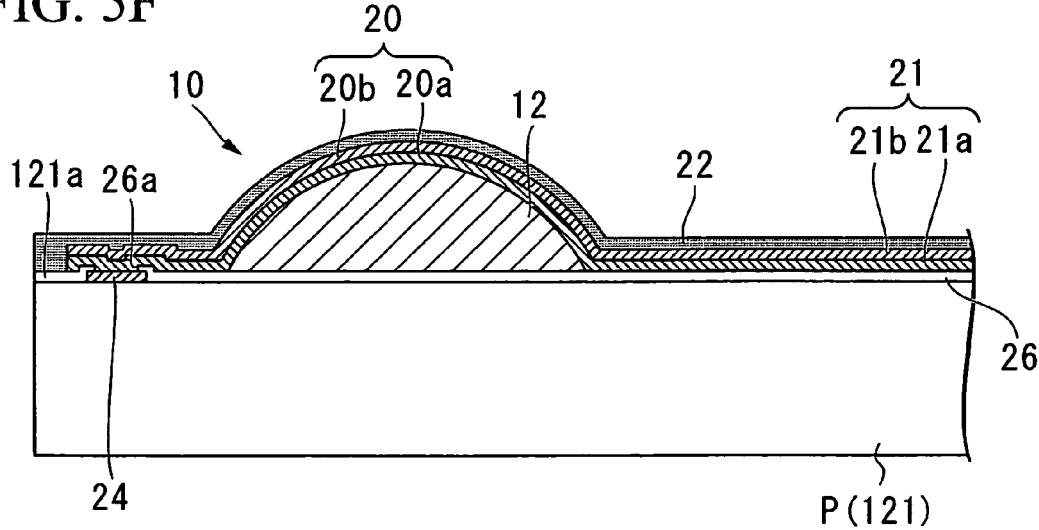

Next, to form the resistance element R, resist layer (resin material) 22 is formed on the conductive films 20 and 21 (passivation film 25 in the region where conductive films 20 and 21 are not formed), as shown in FIG. 5F, by a similar method as described above.

Figure 5G:
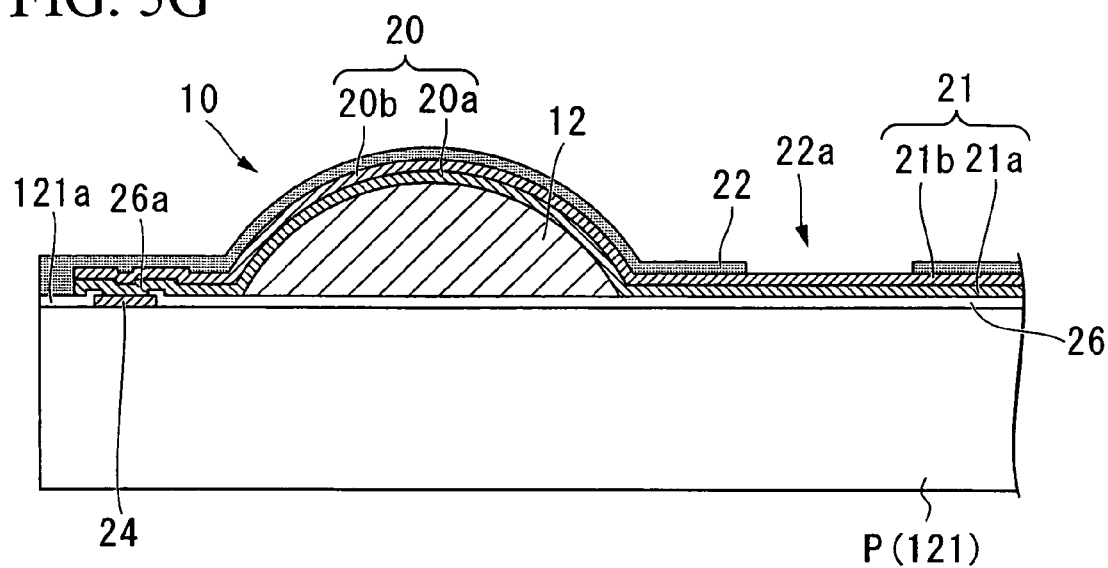

Next, using a mask with an opening to suit the shape and position of the resistance element R, the resist layer is subjected to exposure and development processes, and opening 22a is formed in the resist layer 22, as shown in FIG. 5G. The resist layer 22 is masked, only the conductive film 21b is selectively etched and removed, and the conductive film 21a is exposed. Ferric chloride, ammonium persulfate, and the like, may be used as the etching solution. By removing the resist layer 22 using a stripper and the like, resistance element R with a high resistance value is formed in the conductive film 21, as shown in FIG. 4A and FIG. 4B.

The material, film thickness, and area of the resistance element R are set according to the required resistance value. The resistance value of TiW that constitutes conductive films 20a and 21a when the thickness is 1000Å is about $7 \times 10^{-2}$ $\Omega/m^2$, while that of Au that constitutes conductive films 20b and 21b when the thickness is 1000Å is about $2 \times 10^{-4}$ $\Omega/m^2$. If a resistance value of 70Ω is required in resistance element R, then conductive films 20b and 21b with a width of 10 microns and length of 100 microns may be removed to form the resistance element R. At this stage, if the resistance of conductive films 20a and 21a positioned in a layer lower than the conductive films 20b and 21b that are positioned in the upper layer, is larger, it is beneficial in obtaining a large resistance value.

By varying the thickness of the conductive film mentioned above, or by varying the area of the resistance element R, a resistance element R of say 50 Ω, which is generally used as a terminal resistance, can be easily obtained.

Subsequently, a protective film 23 is formed by covering the resistance element R by resin material (sealing material) such as solder resist, as shown in the alternate long and two short dashes line in FIG. 4B. This helps to enhance the damp proofness of the resistance element R. The protective film 23 should preferably be formed to cover at least the resistance element R, and it can be formed by using a method such as photolithographic method, droplet ejection method, printing method, or dispensing method.

As described above, according to the present embodiment, by varying the thickness of a part compared to that of other parts from the wiring specifications (wire width and thickness) of conductive film 21, or more specifically, by forming only a part of the conductive film 21 of a thickness smaller than only the conductive film 21a, resistance element R is formed. Therefore, there is no need to mount a new resistance material and the like, and a resistance can be formed easily.

A resistance element R can be formed near the semiconductor element through the electrode pad 24 according to the present embodiment; therefore, the shortest electrical path from the semiconductor element to the resistance element R can be attained, eliminating excess wiring.

For this reason, parasitic capacitance due to wiring, stubs and so on can be minimized, and especially, the electrical characteristics (loss, noise emission) in the high frequency range can be enhanced.

Also, according to the present embodiment, materials forming the resistance element R and resistance value can be set to suit the area of the resistance element R. As a result, the desired resistance value can be ensured with high accuracy, and the reliability of the semiconductor device (electronic board) can be enhanced. More specifically, according to the present embodiment, the conductive films 20 and 21 are formed by methods that give high film composition, thickness accuracy, and high dimensional accuracy, such as sputtering, plating and photolithographic method. Thus, the resistance value of the resistance element R can be controlled and managed with a higher accuracy.

Moreover, according to the present embodiment, resistance element R can be formed by removing conductive film 21b from the double-layered conductive film 21. Therefore, by appropriately selecting the etching liquid to suit the conductive film 21b positioned in the upper layer, resistance element R can be easily formed. Particularly, according to the present embodiment, the conductive film positioned in the lower layer 21 has a higher resistance than the conductive film positioned in the upper layer 21b, therefore, a larger resistance value can be easily obtained. That is, according to the present embodiment, by selecting the conductive film of a specific layer from the conductive films of layered construction, and by selecting the type of film to suit the required value of resistance, the design selectability of range of resistance and allowable current value can be improved. The same holds good for constructions with three or more layers.

Second Embodiment

Next, the electronic board related to the second embodiment is described here. According to the second embodiment, the application of the electronic board of the present invention in the Wafer Level Chip Size Package (W-CSP) package is described here referring to FIG. 6A to FIG. 6E.

In these drawings, elements that are the same as the elements of the first embodiment shown in FIG. 1 to FIG. 5G are affixed with the same notations and their explanations are omitted here.

Figure 6A:
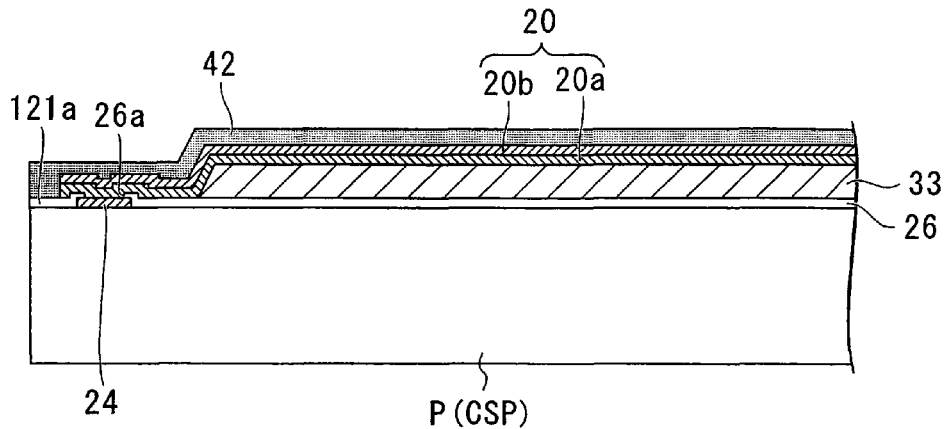
FIGS. 6A, 6B, 6C, 6D, and 6E are process drawings for explaining the package manufacturing method.

According to the present embodiment, resistance element is formed using the process for forming solder balls for the package CSP (electronic board) shown in FIG. 6A.

The conductive film 20 with the double-layered construction of conductive films 20a and 20b in this package CSP, is wired on the passivation film 26 at one end connected to the electrode pad 24, and wired on a stress relaxation layer 33 formed on passivation layer 26 at the other end. The conductive film 20a is laminated on the conductive film 20b.

The stress relaxation layer 33 is formed by resin (synthetic resin). The material for forming this stress relaxation layer may be a material with insulating quality such as polyimide resin, silicone-modified polyimide resin, epoxy resin, silicone-modified epoxy resin, acrylic resin, phenolic resin, benzocyclobutene (BCB), and polybenzoxazole (PBO).

Next, the procedure for forming solder ball and resistance element for the package CSP is described here.

Firstly, as shown in FIG. 6A, solder resist 42 is applied (solder resist layer 42 is formed) on the entire surface of substrate P including the surface on the conductive film 20 (on passivation film 26 or stress relaxation layer 33 in areas where conductive film 20 is not formed) by a method such as spin coating method, dipping method, and spray coating method.

Figure 6B:
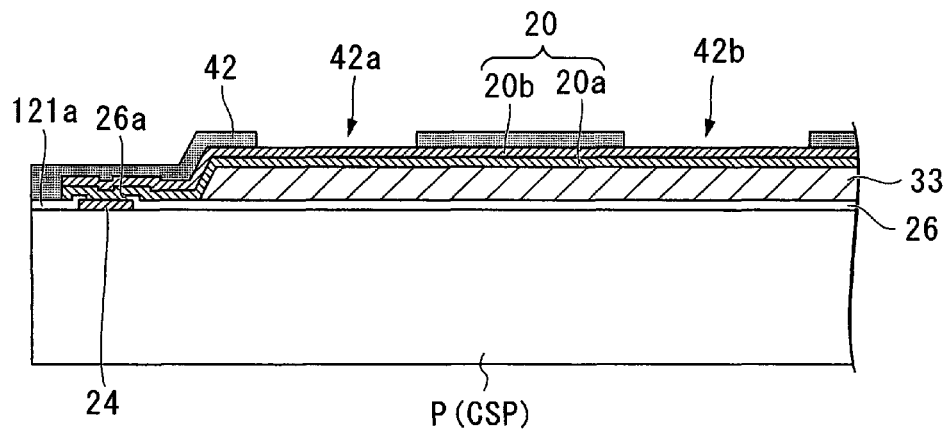
Figure 6C:
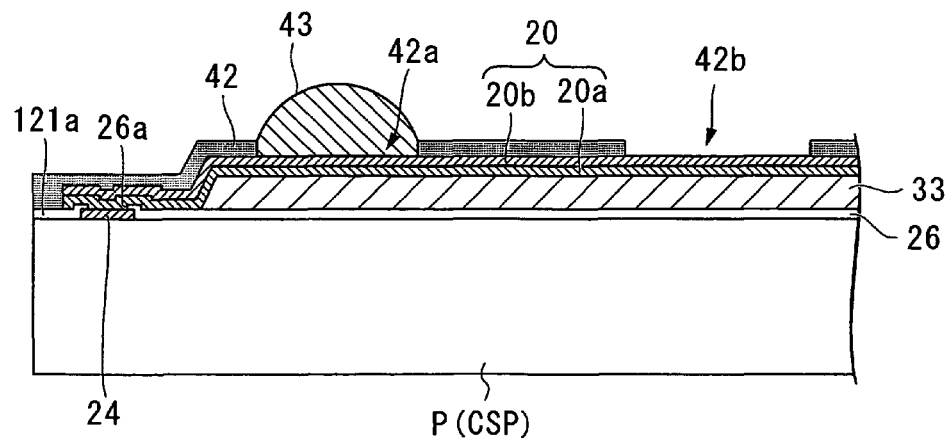

Next, using a mask with an opening suitable for the shape and position of resistance element and solder ball, resist layer is subjected to light exposure and etching treatment. As shown in FIG. 6B, opening 42a exposing the conductive film 20 (conductive film 20b) to solder ball and opening 42b for resistance element are formed. Subsequently, as shown in FIG. 6C, solder ball 43 made of lead-free solder, is provided on the conductive film 20 in the opening 42a as a bump.

Figure 6D:
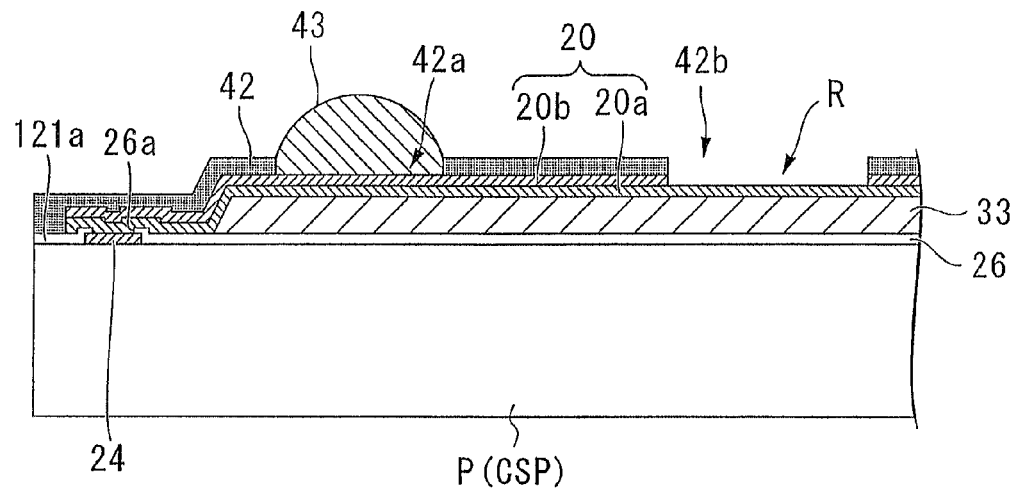

As shown in FIG. 6D, only the conductive film 20 b is selectively etched and removed taking the solder resist layer 42 as the mask, and conductive film 20a is exposed. Ferric chloride, ammonium persulfate, and the like, may be used as the etching solution.

Figure 6E:
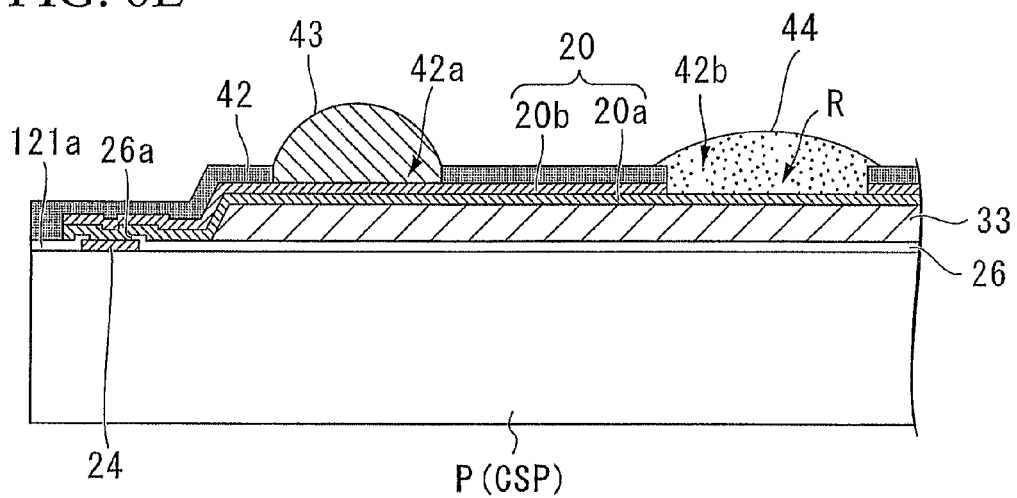

As a result, resistance element R made of conductive film 20a is formed in a part of the conductive film 20. Subsequently, as shown in FIG. 6E, the damp proofness of the resistance element R is improved by sealing the opening 42b with sealing material 4 made of resin and the like. The package CSP with the built-in resistance element R is completed in this way.

According to the present embodiment, similar to the first embodiment mentioned above, resistance element R, set with a resistance value at high accuracy, can be easily integrated in a package such as W-CSP also.

Figure 7:
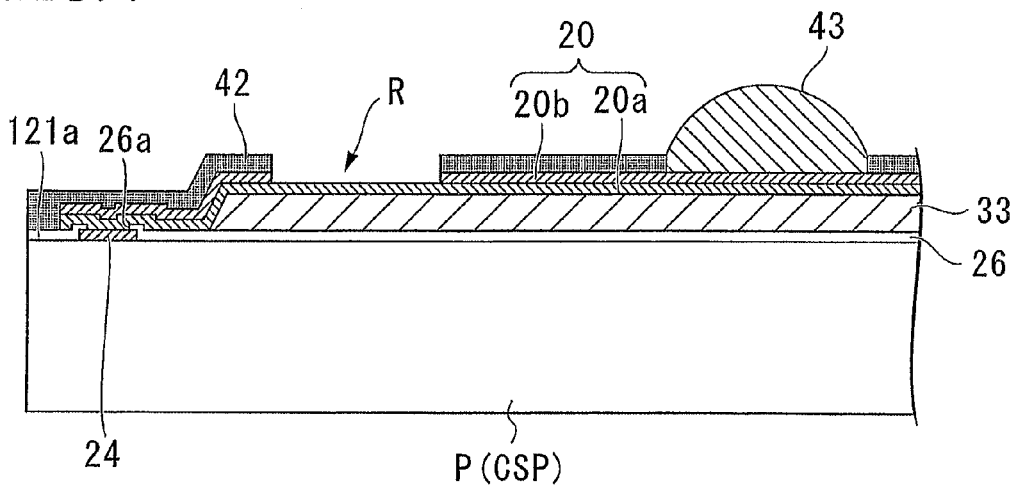
FIG. 7 is a cross section view showing an example of modification of the package.

According to this second embodiment, the resistance element R is installed on the side opposite to electrode pad 24 inserted with solder ball 43, but the invention is not limited to this arrangement only. For instance, as shown in FIG. 7, resistance element R may be installed in the middle of conductive film 20 (that is, the re-oriented wiring) extending from the electrode pad 24 to the solder ball 43.

Electronic Apparatus

Next, electronic apparatus provided with electro-optical device or semiconductor device is described below.

Figure 8:
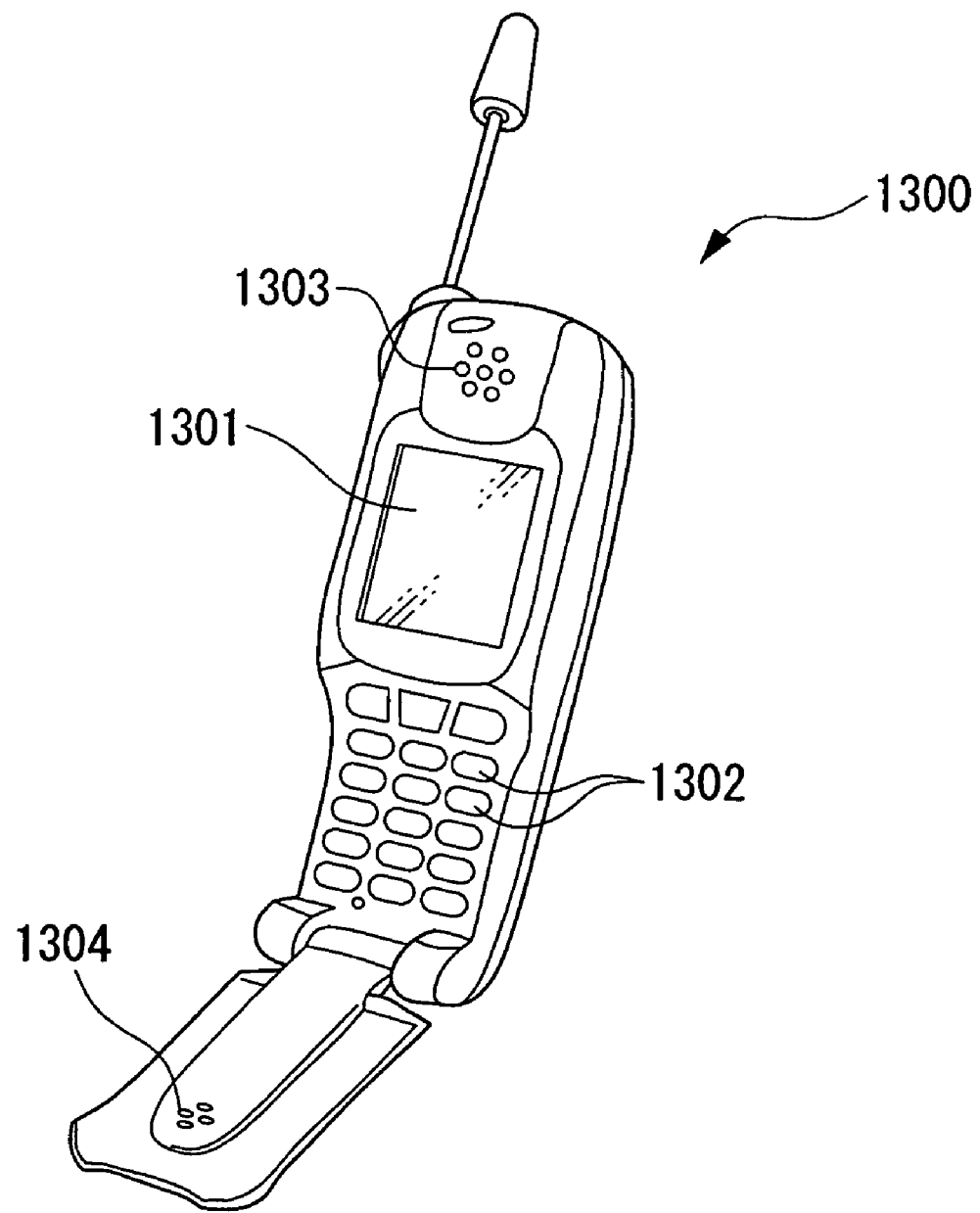
FIG. 8 is a perspective view showing an example of electronic apparatus.

FIG. 8 is a perspective view showing an example of electronic apparatus related to the present invention. Mobile telephone 1300 shown in this figure includes the above-mentioned electro-optical device in the form of a small-sized display unit 1301, multiple control buttons 1302, earpiece 1303, and mouthpiece 1304.

The above-mentioned electro-optical device is not limited to the mobile telephone mentioned above, and it can be used preferably as image display means in various kinds of apparatus provided with touch panels such as electronic book, personal computer, digital still camera, liquid crystal display television, viewfinder type or monitor direct viewing type video tape recorder, car navigation apparatus, pager, electronic organizer, calculator, word processor, workstation, TV phone, POS terminal, and the like. In all the apparatus, the resistance value can be accurately obtained, and electronic apparatus with excellent quality can be offered.

The preferred embodiments related to the present invention have been described referring to the attached drawings as above; however, the present invention is not limited to the examples given. The various shapes of component members or combinations thereof are examples, and various kinds of changes based on design requirements and the like may occur within the scope of the gist of the present invention.

For instance, in the embodiment shown in FIGS. 4A and 4B, resistance element R was formed in the conductive film 21. Alternatively or also, the resistance element may be formed in conductive film 20. In the embodiment shown in FIGS. 4A and 4B, adjacent conductive films 20 were connected by conductive film 21, but it is not limited to this configuration. Resistance element may be installed in a part of the re-oriented wires that form the external connection terminal.

Figure 9A:
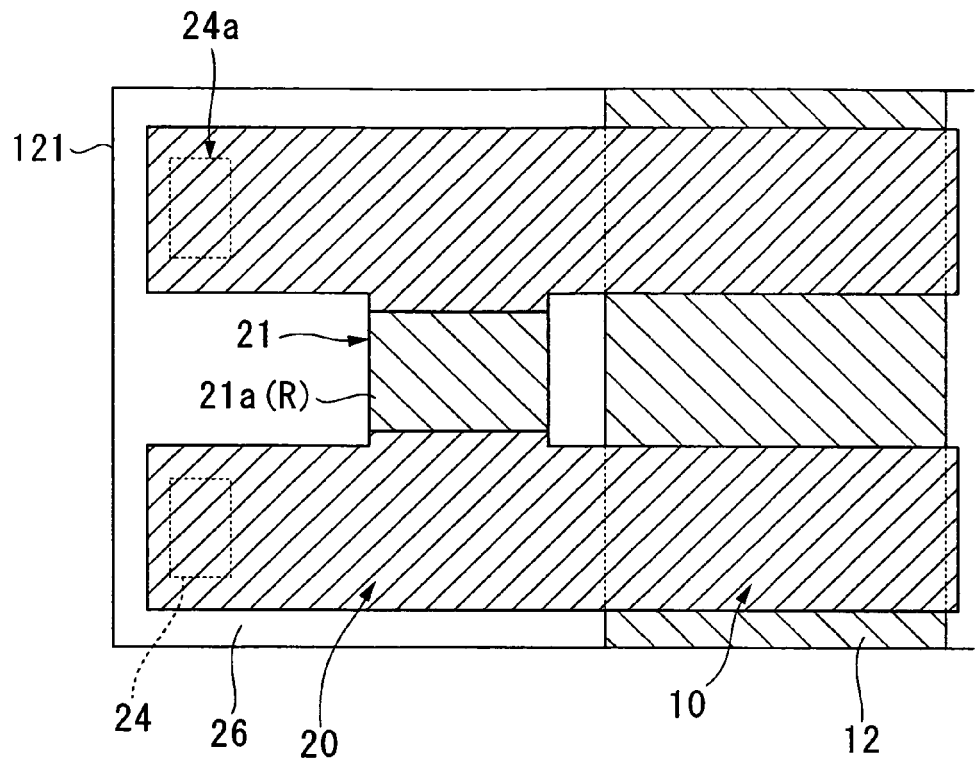
FIG. 9A and FIG. 9B are plan views showing the examples of modification of the resistance element.
Figure 9B:
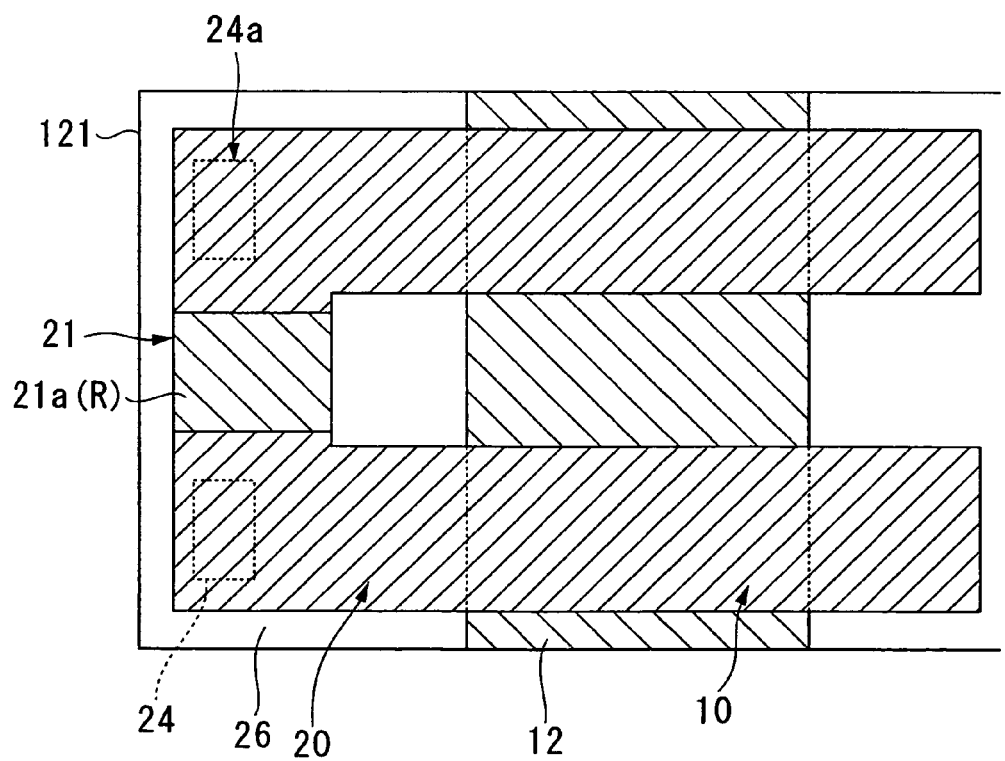

Furthermore, according to the above-mentioned embodiment, the configuration used was conductive film 20 was connected to electrode pad 24 with conductive film 21 at the end on the opposite side, but in addition, as shown in FIG. 9A, the configuration in which the conductive film 20 is connected by conductive film 21 between the bump electrode 10 and electrode pad 24 may be used; or as shown in FIG. 9B, the configuration in which the conductive film 20 is connected at the end of the electrode pad 24 by the conductive film 21 may also be used.

According to the embodiment mentioned above, resistance element R was formed by removing one layer of film from the double-layered electrode film 21. Note, however, that the present invention is not limited to a double-layered film; electrode film with a single layer or electrode film with more than three layers may be used also. For instance, if an electrode film with a single layer is used, the thickness may be adjusted by adjusting the etching time, and adjustments may be made to the thickness of the resistance section so that it is smaller than the thickness at other locations, and the desired resistance value may be obtained. A three-layered electrode film can be configured by forming say TiW—Cu first by sputtering, and then forming Cu layer by plating. Resistance element can be formed with TiW—Cu by sputtering after removing electrode film by Cu plating, or resistance element can also be formed with only TiW electrode film after removing the Cu (sputtering)—Cu (plating) electrode film.

Moreover, even if a double-layered electrode film is used, a part of the conductive film in the upper layer 21b, may be allowed to remain in the thickness direction, and resistance element may be formed with the remaining conductive film 21b and the conductive film in the lower layer 21a. Furthermore, after removing the conductive film 21b, conductive film 21a may be etched, and a resistance element with a higher resistance value may be formed with a thinner conductive film 21a. In any case, by removing a part of the conductive film to suit the desired resistance value, a resistance element with the relevant resistance value can be easily formed.

Figure 10A:
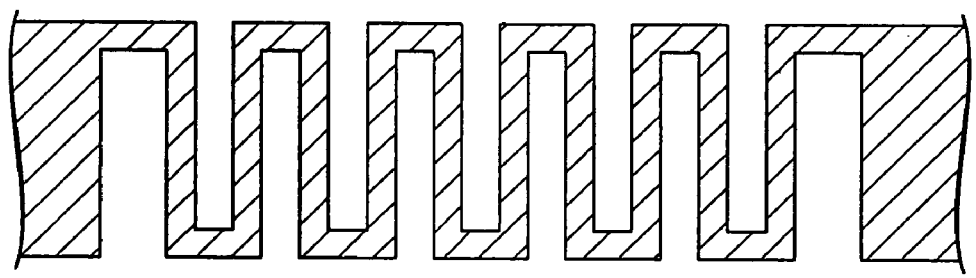
FIG. 10A and FIG. 10B are plan views showing the examples of modification of the resistance element.
Figure 10B:
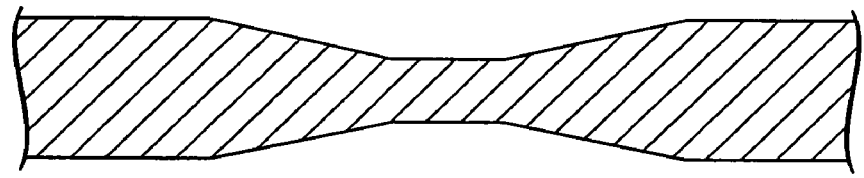

Furthermore, the method of forming resistance element is not limited only to removal of material in the thickness direction. It can also be formed by making the width of a part of the conductive film (wiring pattern) smaller than the width of the other parts. For instance, as shown in FIG. 10A, a resistance element with large resistance valued formed with a meandering shape of wire width finer than in other parts, or as shown in FIG. 10B, a resistance element with reduced diameter part (constricted shape) having a large resistance may be used.

Figure 11:
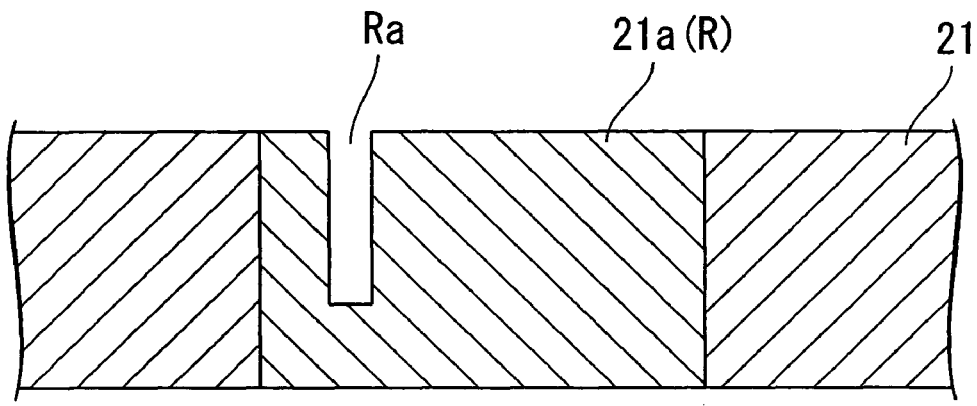
FIG. 11 is a drawing for explaining the method of making fine adjustments to the resistance value.

Also, according to the present embodiment, the resistance value of the resistance element was described as being adjusted by the width or thickness of the conductive film, but as shown in FIG. 11, for a resistance element R formed by exposing the conductive film 21 a in a part of the conductive film 21, a notched part Ra may be provided, which is obtained by cutting off (removing) a part of the conductive film after trimming it using laser or other means.

In this case, fine adjustments can be made to the resistance value by adjusting the size of the notched part Ra (that is, the size with which the conductive film 21a is connected), and resistance element with high accuracy can be easily formed. Especially, according to the present embodiment, resistance element R can be disposed near the surface of the semiconductor device 121, therefore, fine adjustments of the resistance value can be made easily.

The material of conductive film (resistance element) shown in the above-mentioned embodiment is only one example. Other conductive materials such as Ag, Ni, Pd, Al, Cr, Ti, W, NiV, or lead-free solder and the like may also be used. In these cases also, when forming layered conductive film using multiple materials, it is preferable to select the materials such that the conductive film positioned in the lower layer has a higher resistance than the conductive film positioned in the upper layer. By selection and combination of materials, not only can the desired resistance value be obtained, but also by focusing on the resistance-temperature characteristics of each material and appropriately combining the materials, the desired resistance-temperature characteristics can be obtained.

In the above-mentioned embodiment, the conductive films 20 and 21 were formed by sputtering method and plating method, but the inkjet method may also be used.

In the embodiment above, the example of a semiconductor device that includes electronic board with semiconductor elements was used, but the electronic board related to the present invention does not necessarily require semiconductor elements to be installed. For instance, a non-mounted silicon substrate in which external devices are not mounted in the area provided for mounting external devices (active area) of the semiconductor chip may be included. In this case, the electronic board related to the present invention may be connected to the circuit substrate with semiconductor elements through the bump electrode 10, and other electronic circuits may also be included in the substrate. These may include electronic devices such as liquid crystal panel, plasma display, or crystal oscillator.

Furthermore, in these embodiments, the resistance element may be formed using a part of the wiring. Therefore, it may not always be connected to the electrode of the electronic board; it can contribute only to the connection of electrodes, and it may not be connected to external electrodes or external terminals.

Even in electronic apparatus, according to the above-mentioned embodiment, a mobile telephone provided with electro-optical device was illustrated, but an electro-optical device need not always be provided; an electronic apparatus provided with the above-mentioned electronic board without an electro-optical device is also included in the-present-invention.

Figure 12:
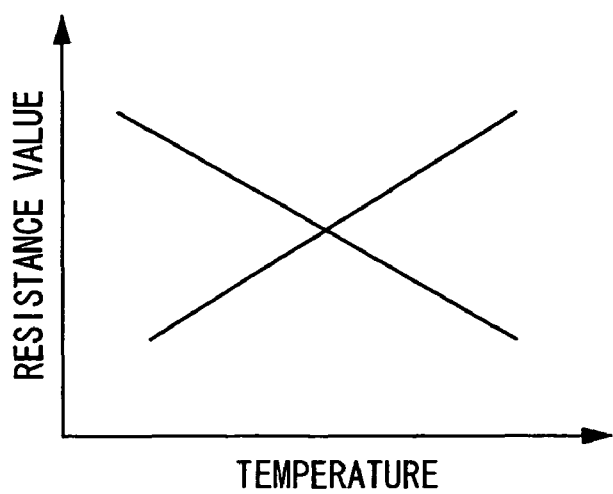
FIG. 12 is a drawing showing the relationship between temperature and resistance value.

Moreover, the present invention can be used in all electronic apparatus using multi-layered film wiring. For instance, conductive film with variability in resistance value having an inverse relationship with temperature variability can also be used in laminated wiring patterns. For instance, as shown in FIG. 12, by depositing conductive film formed by a material with characteristics that increase the resistance value with the rise in temperature (such as $RuO_2$) and conductive film formed by a material with characteristics that decrease the resistance value with the rise in temperature such as $Ta_2N$, wiring pattern that cancels the temperature drift can be used.

What is claimed is:

1. An electronic board, comprising:
    a substrate having a surface on which electrode sections are disposed in a row along a first direction;
    a resin member provided on the surface of the substrate and adjacent to the electrode sections, the resin member extending in at least the first direction; and
    a wiring pattern provided on the surface of the substrate and electrically connected to the electrode sections, wherein
    the wiring pattern includes:
        a first conductive film extending in at least a second direction that intersects the first direction, the first conductive film covering one of the electrode sections and a part of the resin member;
        a second conductive film extending in at least the second direction, the second conductive film covering another one of the electrode sections and another part of the resin member;
        a first terminal formed by a part of the first conductive film that covers the part of the resin member;
        a second terminal formed by a part of the second conductive film that covers the another part of the resin member;
        a connecting section that electrically connects the first and second conductive films; and
        a resistance element having conductivity, the resistance element being a part of the connecting section, and wherein
    the first conductive film and the second conductive film each have a double layer configuration including a first film and a second film laminated on the first film;
    the second film is a different material than the first film;
    the first film connects:
        the one of the electrode sections and the part of the resin member; and
        the another one of the electrode sections to the another part of the resin member; and
    the connecting section has:
        a double layer configuration at both ends thereof including the first film and the second film laminated on the first film; and
        a single layer configuration including the first film but not the second film at the part of the connecting section forming the resistance element.

2. The electronic board according to claim 1, wherein the resin member comprises an elastic resin material.

3. The electronic board according to claim 1, wherein the first and second terminals are disposed between the resistance element and the electrode sections in the second direction.

4. The electronic board according to claim 1, wherein the resistance element is sealed by a sealing material.

5. The electronic board according to claim 1, further comprising:
    a semiconductor element; and
    wherein at least one of the electrode sections is an external terminal of the semiconductor element.

6. An electro-optical device on which the electronic board according to claim 1 is mounted.

7. An electronic apparatus comprising the electronic board according to claim 1.

8. The electronic board according to claim 1, wherein the material of the first film has a resistance value that is higher than that of the material of the second film.

* * * * *